United States Patent
DeBhailis et al.

(10) Patent No.: US 7,259,639 B2
(45) Date of Patent: Aug. 21, 2007

(54) INDUCTOR TOPOLOGIES AND DECOUPLING STRUCTURES FOR FILTERS USED IN BROADBAND APPLICATIONS, AND DESIGN METHODOLOGY THEREOF

(75) Inventors: Deirdre Anne DeBhailis, Cork (IE); Bill Allen Keeney, Cork (IE); Piotr Miroslaw Solski, Cork (IE)

(73) Assignee: M/A-Com Eurotec, B.V., Cork (IE)

( * ) Notice: Subject to any disclaimer, the term of this patent is extended or adjusted under 35 U.S.C. 154(b) by 367 days.

(21) Appl. No.: 10/403,343

(22) Filed: Mar. 28, 2003

(65) Prior Publication Data
US 2004/0027212 A1    Feb. 12, 2004

Related U.S. Application Data

(63) Continuation-in-part of application No. 10/113,660, filed on Mar. 29, 2002.

(60) Provisional application No. 60/373,268, filed on Apr. 17, 2002, provisional application No. 60/373,264, filed on Apr. 17, 2002, provisional application No. 60/373,255, filed on Apr. 17, 2002.

(51) Int. Cl.
*H03H 7/48*    (2006.01)

(52) U.S. Cl. ............... 333/132; 333/167; 333/175

(58) Field of Classification Search ............ 333/185, 333/175, 167, 132
See application file for complete search history.

(56) References Cited

U.S. PATENT DOCUMENTS

| | | | | |
|---|---|---|---|---|
| 3,718,874 A | * | 2/1973 | Cooper, Jr. ............ | 333/204 |
| 4,075,591 A | * | 2/1978 | Haas .................... | 336/200 |
| 4,201,965 A | * | 5/1980 | Onyshkevych .......... | 336/180 |
| 4,622,627 A | | 11/1986 | Rodriguez et al. | |
| 4,849,721 A | * | 7/1989 | Matsuura ............... | 333/174 |
| 5,032,810 A | * | 7/1991 | Kaneko et al. .......... | 333/185 |
| 5,173,671 A | | 12/1992 | Wendler et al. | |
| 5,255,318 A | | 10/1993 | Gurusami et al. | |
| 5,697,087 A | | 12/1997 | Miya et al. | |
| 5,745,857 A | | 4/1998 | Maeng et al. | |
| 5,777,277 A | * | 7/1998 | Inagawa ................ | 174/265 |

(Continued)

FOREIGN PATENT DOCUMENTS

DE    3942509    6/1991

(Continued)

OTHER PUBLICATIONS

Brian C. Wadell, Transmission Line Design Handbook, (1991) Chapter 6, pp. 381-414. Artech House Inc., 685 Canton Street, Norwood, MA 02062.

(Continued)

*Primary Examiner*—Robert Pascal
*Assistant Examiner*—Kimberly E Glenn

(57) ABSTRACT

Inductor topologies for filters used in broadband applications are described. In one implementation, an apparatus, such as an interface module includes a printed circuit board and a filter. The filter includes a generally circular high Quality factor (Q) value spiral planar inductor etched directly into the printed circuit board. The generally circular high Q value spiral planar inductor is configured to operate in a broadband application. Other implementations involve the use of decoupling structures with respect to the planar inductors as well as a design methodology for the filters.

76 Claims, 4 Drawing Sheets

U.S. PATENT DOCUMENTS

| | | | |
|---|---|---|---|
| 6,002,593 | A | 12/1999 | Tohya et al. |
| 6,069,397 | A * | 5/2000 | Cornett et al. ............... 257/531 |
| 6,072,394 | A | 6/2000 | Hasegawa et al. |
| 6,114,938 | A * | 9/2000 | Iida et al. .................... 336/200 |
| 6,175,727 | B1 | 1/2001 | Mostov |
| 6,285,865 | B1 | 9/2001 | Vorenkamp et al. |
| 6,287,931 | B1 * | 9/2001 | Chen ........................... 438/381 |
| 6,380,608 | B1 | 4/2002 | Bentley |
| 6,396,709 | B1 * | 5/2002 | Schmich ..................... 361/760 |
| 6,397,171 | B1 | 5/2002 | Belk |
| 6,448,873 | B1 * | 9/2002 | Mostov ....................... 333/185 |
| 6,466,122 | B1 | 10/2002 | Hasegawa et al. |
| 6,590,473 | B1 | 7/2003 | Seo et al. |
| 6,734,767 | B2 * | 5/2004 | Vanoverschelde et al. .. 333/214 |
| 6,847,282 | B2 | 1/2005 | Gomez et al. |
| 6,894,585 | B2 | 5/2005 | Keeney et al. |
| 2002/0050626 | A1 | 5/2002 | Onuma et al. |
| 2004/0189422 | A1 | 9/2004 | De Bhailis et al. |
| 2005/0116802 | A1 | 6/2005 | Gomez et al. |

FOREIGN PATENT DOCUMENTS

| | | |
|---|---|---|
| EP | 1 304 707 A2 | 4/2003 |
| EP | 1 304 707 A3 | 5/2003 |
| EP | 1 484 773 A1 | 12/2004 |
| GB | 783549 | 9/1957 |
| JP | 2001 202 489 | 7/2001 |
| JP | 2004031520 | 1/2004 |

OTHER PUBLICATIONS

De Bhailis et al., "High Q Planar Spiral Inductors for CATV Filter Applications" IMAPS 2001 Proceedings, May 30, 2001.

Rajesh Mongia et al., "RF and Microwave Coupled-line Circuits," Boston, Artech House, 1999, pp. 372-383.

Bill Keeney, "Applications for E-Series Components in Cable Modem Systems," M/A Com Loud and Clear, vol. 6, No. 1, Spring/Summer 1999.

Search report for De Bhailis et al., EP 1484773.

* cited by examiner

INDUCTOR TOPOLOGIES AND DECOUPLING STRUCTURES FOR FILTERS USED IN BROADBAND APPLICATIONS, AND DESIGN METHODOLOGY THEREOF

CROSS-REFERENCE TO RELATED APPLICATIONS

The present patent application is a continuation-in-part of U.S. patent application Ser. No. 10/113,660, entitled "High Quality Factor (Q) Planar Spiral Inductor Based CATV Diplexer and Telephony Module," by Keeney, et al. having a filing date of Mar. 29, 2002, and is commonly assigned herewith. This application also claims the benefit of provisional application Nos. 60/373,268, 60/373,264 and 60/373,255 filed Apr. 17, 2002. The contents of the aforementioned applications are fully incorporated herein by reference.

TECHNICAL FIELD

The present invention relates to filters and components used in broadband applications.

BACKGROUND

"Broadband" generally refers to methodologies used to send and receive data over high-speed networks. Broadband, as opposed to narrowband, usually implies a bandwidth capability of greater than 45 Mbps where there is voice quality movement of data. Broadband is commonly associated with, although not limited to, a way of connecting a local computer or other device to a high-speed network, such as the Internet.

Broadband connections, whether through cable, digital subscriber lines, optical, wireless, or satellites, typically involve the use of some type of interface module, such as a modem, for handling bi-directional transmissions of data. Many interface modules use various types of filters to remove information content such as high and/or low frequencies, for example. These filters usually include one or more high quality factor (Q) torroidal inductors. "Q" represents the efficiency of an inductor in terms of storing a magnetic field.

Torroidal inductors having high Q values are discreet parts typically fabricated by manually wrapping wires around ferromagnetic cores. The fabrication process is labor intensive and can lead to high manufacturing costs. There are also problems associated with procuring parts and correctly installing them on a printed circuit board. All these problems can lead to higher manufacturing costs.

SUMMARY

Inductor topologies and decoupling structures for filters used in broadband applications are described. In one described implementation, an apparatus, such as an interface module includes a printed circuit board and a filter. The filter includes a generally circular high Quality factor (Q) value spiral planar inductor etched directly into the printed circuit board. The generally circular high Q value spiral planar inductor is configured to operate in a broadband application.

In another described implementation, an apparatus includes a printed circuit board, a filter, and a decoupling structure. The filter includes first and second generally circular high Quality factor (Q) value spiral planar inductors etched into the printed circuit board. A decoupling structure is etched into the printed circuit board in proximity to the first and second generally circular high Q value spiral planar inductors. The decoupling structure is configured to reduce unwanted electromagnetic coupling between the first and second generally circular high Q value spiral planar inductors when current flows through them.

In yet another described implementation, a methodology includes simulating a filter layout for a broadband application. The layout includes a plurality of generally circular high Quality factor (Q) value spiral planar inductors etched directly onto a printed circuit board. Coupling is quantified between the generally circular high Q value spiral planar inductors. The coupling is compensated for by (i) introducing decoupling structures into the broadband filter layout (ii) changing inductor values for at least one of the generally circular high Q value spiral planar inductors and/or (iii) modifying the filter layout.

The described implementations, therefore, introduce the broad concept of using generally circular high Q value spiral planar inductors fabricated directly into the printed circuit board using etching or equivalent processes. This avoids costs associated with discrete parts such as ferrite toriod based inductors. Additionally, manufacturing costs and problems associated with installation and procurement of parts is eliminated. In some implementations, it is possible to use elliptically shaped spiral inductors to further occupy a minimal amount of circuit board "real estate."

The described implementations, also introduce the broad concept of using generally circular high Q value spiral planar inductors fabricated directly into the printed circuit board and compensating for unwanted electromagnetic coupling associated with them.

BRIEF DESCRIPTION OF THE DRAWINGS

The detailed description is described with reference to the accompanying figures. In the figures, the left-most digit(s) of a reference number identifies the figure in which the reference number first appears.

DETAILED DESCRIPTION

Architecture

Figure 1A:
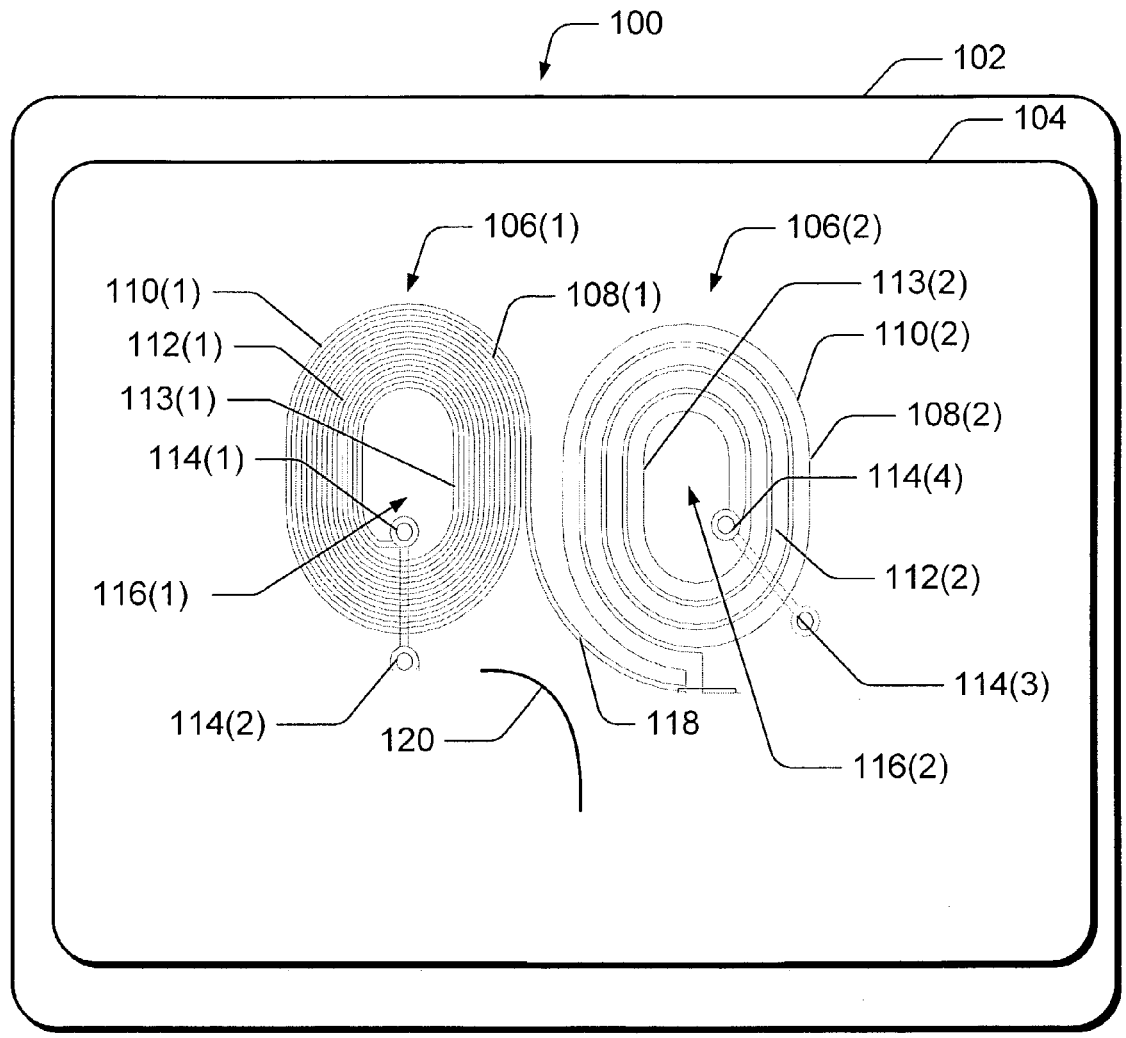
FIG. 1A shows an apparatus used in broadband applications.

FIG. 1A shows an apparatus 100 used in broadband applications. Apparatus 100 may be a broadband interface module used to connect two devices together in a broadband environment, such as subscriber device shown to the Internet. For example, apparatus 100 may be a set-top box, a cable television module, an optical modem, a DSL-based modem, and other related devices that operate in a broadband environment.

Apparatus 100 typically includes one or more printed circuit boards containing various circuits. In the exemplary illustration, apparatus 100 includes a printed circuit board 102 being an FR4 substrate circuit board. However, printed circuit board 102 may be another type of board used to connect circuits and chips. Printed circuit board 102 may be single sided, double sided, multi-level, and capable of receiving other printed circuit boards. Additionally, the conductors used within the printed circuit board may contain copper, or other conductive materials.

Typically, contained on printed circuit board 102 is one or more filters 104 used to perform some type of input/output filtering operation involving some type of broadband application. For instance, filter 104 may be a diplexer, a duplexer, a tri-plexer, a high pass filter, a low pass filter and so forth. For example, filter 104 may operate in a range from about 1-to-1000 MHz, however, other ranges, greater or smaller, are possible.

Typically, contained within each filter 104 is one or more generally circular high Q value spiral planar inductors that are etched directly into the printed circuit board 102, configured to operate in a broadband environment. In the exemplary illustration, filter 104 includes two generally circular high Q value spiral planar inductors 106(1) and 106(2), referred to generally as inductors 106. As used herein, "generally circular" means a shape that is generally round such as a circle, rounded rectangles, racetrack shaped circles (e.g., an ellipse or oval), volute and other generally circular forms. Generally circular also includes objects that are planar, but deposed within the printed circuit board at different levels such as a helical spiral. Both inductors 106 used in this example are elliptical in shape.

Each inductor 106 includes generally circular conductive traces, generally referred to as reference number 108, that are etched directly into the printed circuit board 102. The conductive traces 108 are conductive tracks etched into a conductive layer of the printed circuit board 102. An outer most conductive trace (referred to generally as 110) for each inductor, wraps around inner conductive traces (referred to generally as 112) that form a spiral leading to an inner most conductive trace (referred to generally as 113). The inner most conductive trace 113 wraps around a center portion (referred to generally as 116) of the inductor, the center portion 116 having no conductive traces.

Each track (e.g. trace 108) may be monolithically deposited within the printed circuit board through a wide range of printed circuit board processing techniques. In the exemplary illustration, traces 108 are photo-etched into the printed circuit board 102, because photo-etching provides the capability to produce finer tracks and closer gaps. For example, it may be necessary to have gaps between the traces in the range of 6 mils (e.g., about 0.2 mm, about 0.152 mm, or about 0.12 mm), or even down to three-thousandths (0.003) of an inch, which generally involves some sort of photo-etching or equivalent process. Additionally, through photo-etching, it is possible to consistently and repetitively manufacture traces within strict dimensional tolerances.

In the exemplary illustration, inductors 106(1) and 106(2) are coupled together via a trace 118. Depending on the application, each inductor 106 may be connected to other components, such as capacitors (not shown in FIG. 1A), which may be discrete or parasitic. In such applications, each inductor may be configured to provide a self-resonant frequency for inductances of about 40 to 400 nH; however, other ranges greater or smaller are possible. Each inductor may connected to ground or a current source through vias 114(1)-114(4) connected to the traces (i.e., winding) 108.

Generally circular high Q value planar spiral inductors are open structures, and therefore generate magnetic and electrical fields, which tend to travel through air and cross through conductive traces of adjacent spirals modifying their inductances. Modification of inductances in turn affects the resonators (see FIG. 3 for example of a resonator). This phenomena, referred to as "coupling" may significantly and adversely affect the performance of filters. Being able to compensate for these coupling affects is desirable.

Decoupling structures, such as a decoupling structure 120 (shown in FIG. 1A) can be used to reduce inter-filter and intra-filter coupling once the coupling effects are quantified. Decoupling structure 120 can be etched into the printed circuit board in proximity to the inductors 106 to reduce coupling. That is, decoupling structure 120 is configured to reduce unwanted electromagnetic coupling between the inductors 106 when current flows through them. The decoupling structure may embody any shape or size, but is generally minimized to reduce "real estate" needed on the printed circuit board 102. For example, decoupling structure 120 may be a narrow trace of conductive metal that is grounded or ungrounded. By positioning decoupling structure 120 near inductors 106, inductors 106 cause a current to flow in the decoupling structure 120, thereby generating a magnetic field having a sense of polarization opposite that of the magnetic fields generated by the inductors 106. Because the magnetic field generated by the decoupling structure 120 opposes the magnetic field generated by the spiral inductors 106, the effects of intra-filter or inter-filter coupling are reduced.

Figure 1B:
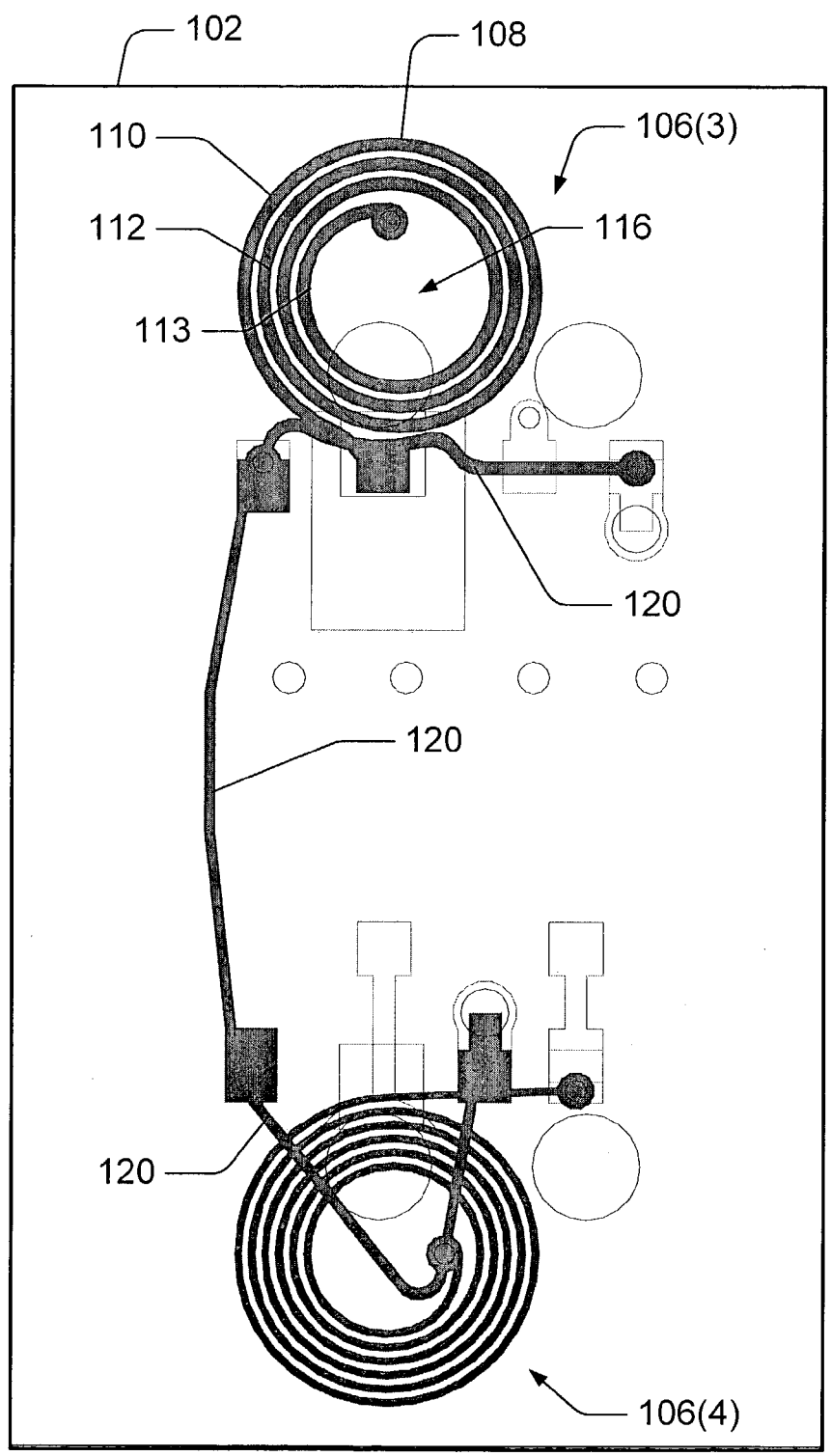
FIG. 1B shows two generally circular high Q value planar spiral inductors decoupled from one another by a decoupling structure.

FIG. 1B shows two generally circular high Q value planar spiral inductors 106(3) and 106(4) decoupled from one another by a decoupling structure 120. FIG. 1B also shows another view of conductive traces 108 that are etched directly into a printed circuit board 102. Referring to inductor 106(3) of FIG. 1B are circular conductive traces 108 that are etched directly into the printed circuit board 102. An outer most conductive trace 110 wraps around inner conductive traces 112 that form a spiral leading to an inner most conductive trace 113. The inner most conductive trace 113 wraps around a center portion 116 of inductor 106(3), the center portion 116 having no conductive traces.

Referring back to FIG. 1A, it is possible that other elements and components may be included in apparatus 100, including discrete parts. Different quantities of each of the components (greater or smaller) described above may also be included, such as using only a single generally circular high Q value spiral inductor or using more than two of the generally circular high Q value spiral inductors.

Figure 2:
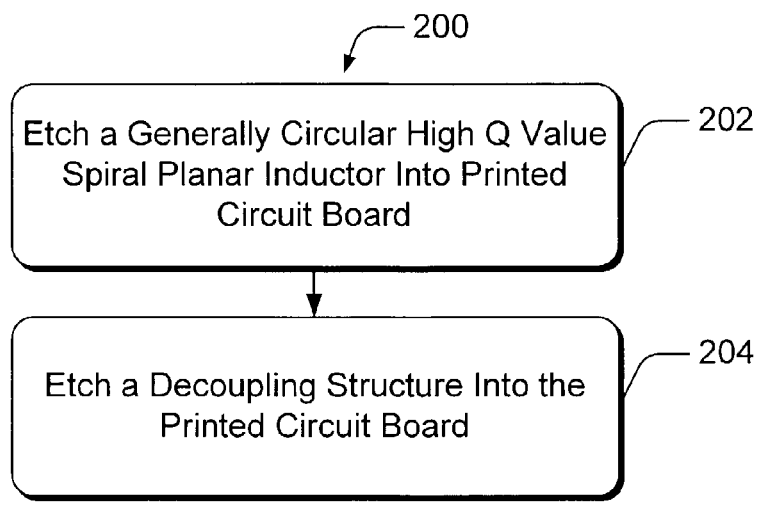
FIG. 2 is a method for making at least one high Q value spiral planar inductor and a decoupling structure such as the exemplary ones shown in FIG. 1.

FIG. 2 is a method 200 for making at least one high Q value spiral planar inductor and a decoupling structure such as the exemplary ones shown in FIGS. 1A and 1B. Method 200 includes blocks 202 and 204. The order in which the method is described is not intended to be construed as a limitation.

In block 202, a generally circular high Q value spiral planar inductor is etched into a printed circuit board. For example, an inductor 106 (FIGS. 1A and 1B) is etched into a printed circuit board 102 (FIGS. 1A and 1B) using printed circuit board techniques, such as photo-etching. To further reduce the amount space required by the inductors and optimize layout space, the generally circular inductors may be elliptical in shape, such as shown in FIG. 1A (as opposed to purely circular inductors as shown in FIG. 1B).

In block 204, a decoupling structure may be embedded in the printed circuit board in proximity to the spiral inductor to reduce magnetic coupling. For example, decoupling structure 120 may be etched into printed circuit board 102 in proximity to two inductors 106(1) and 106(2) (or 106(3) and 106(4)) to reduce coupling when current flows through the inductors 106. Quantifying coupling shall be described in greater detail below.

Figure 3:
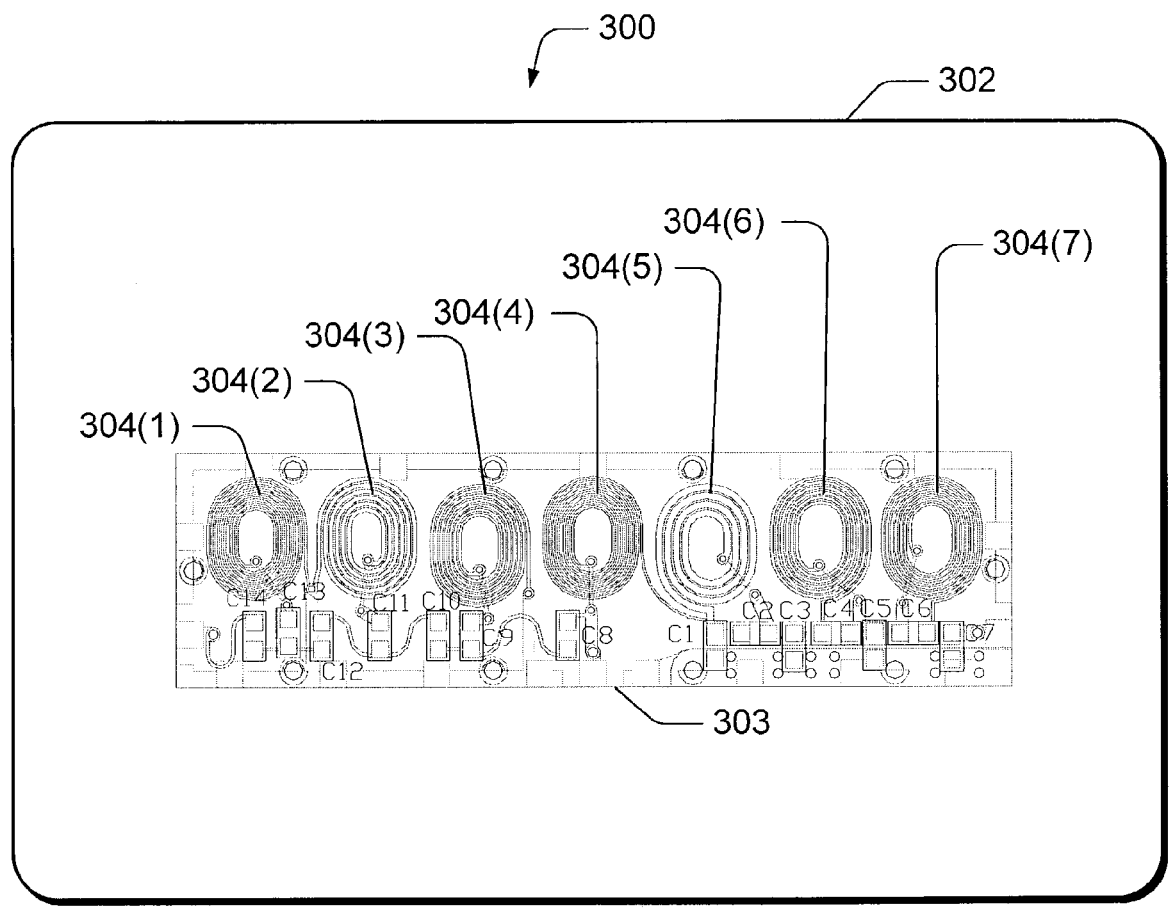
FIG. 3 shows an exemplary apparatus configured to operate as an interface module in a broadband environment.

FIG. 3 shows an exemplary apparatus 300 configured to operate as an interface module in a broadband environment. In particular, apparatus 300 is configured as a diplexer and includes a filter 302. Filter 302 includes generally circular high Q value spiral planar inductors 304(1)-304(7), embedded within a printed circuit board 303. Inductors 304(1), 304(2), and 304(3), along with capacitors C8-C14 make-up a high pass filter portion of the diplexer, whereas inductors 304(4)-304(7) along with capacitors C1-C7 make up a low pass filter portion of the diplexer. Resonator pairs are established between various inductors 304 and capacitor pairs in both the high pass and low pass filter sections. For instance, a least wound inductor 304(5), and capacitor C2, form a resonator pair, and inductor 304(6) and capacitor C4 form a resonator pair, and so forth. A metal cover (not shown) may also be included as a part of apparatus 300.

Design Methodology

To better identify coupling between spiral inductors it important to understand how a circuit that utilizes generally circular high Q value spiral planar inductors operates in a simulated environment prior to being etched into a printed circuit board. Unlike devices that use discreet inductors, it is difficult to tweak couplings between inductors once components have been placed onto a printed circuit board. That is why a spiral based filter design process may be used with the introduction of any new filter design.

In one implementation, a design synthesis and optimization process includes synthesizing a particular filter design (such as diplexer shown in FIG. 3) or other device/module either by hand or automatically by using software-bases design synthesis package, such as the EAGLEWARE GENESYS design synthesis package. One or more generally circular high Q value spiral planar inductors are designed per the synthesized values as separate inductors in an electromagnetic (EM) simulator. Optionally, Z or S-parameter data blocks, which are generated by the EM simulator or manual measurement, may then be substituted into a lumped element model for subsequent simulation by the EM simulator.

Next, a suitable printed circuit board layout may be completed and imported into the EM simulator. This layout (i.e., the circuit layout) may then be EM simulated and the coupling (K) factors between the generally circular high Q value spiral planar inductors are extracted.

Next, the K factors are loaded into a new lumped element model and all of the inductive and capacitive elements of the filter or device are optimized. Thus, the design process allows the coupling between the generally circular high Q value spiral planar inductors to be quantified and compensated.

Next, the circuit layout is modified according to the lumped element simulation results and a new EM simulation is performed. Decoupling structures, such as decoupling structure 120 shown in FIG. 1, can then be applied in the EM simulator to modify the K factors. Finally the design synthesis and optimization process is repeated until desired performance characteristics are achieved.

Figure 4:
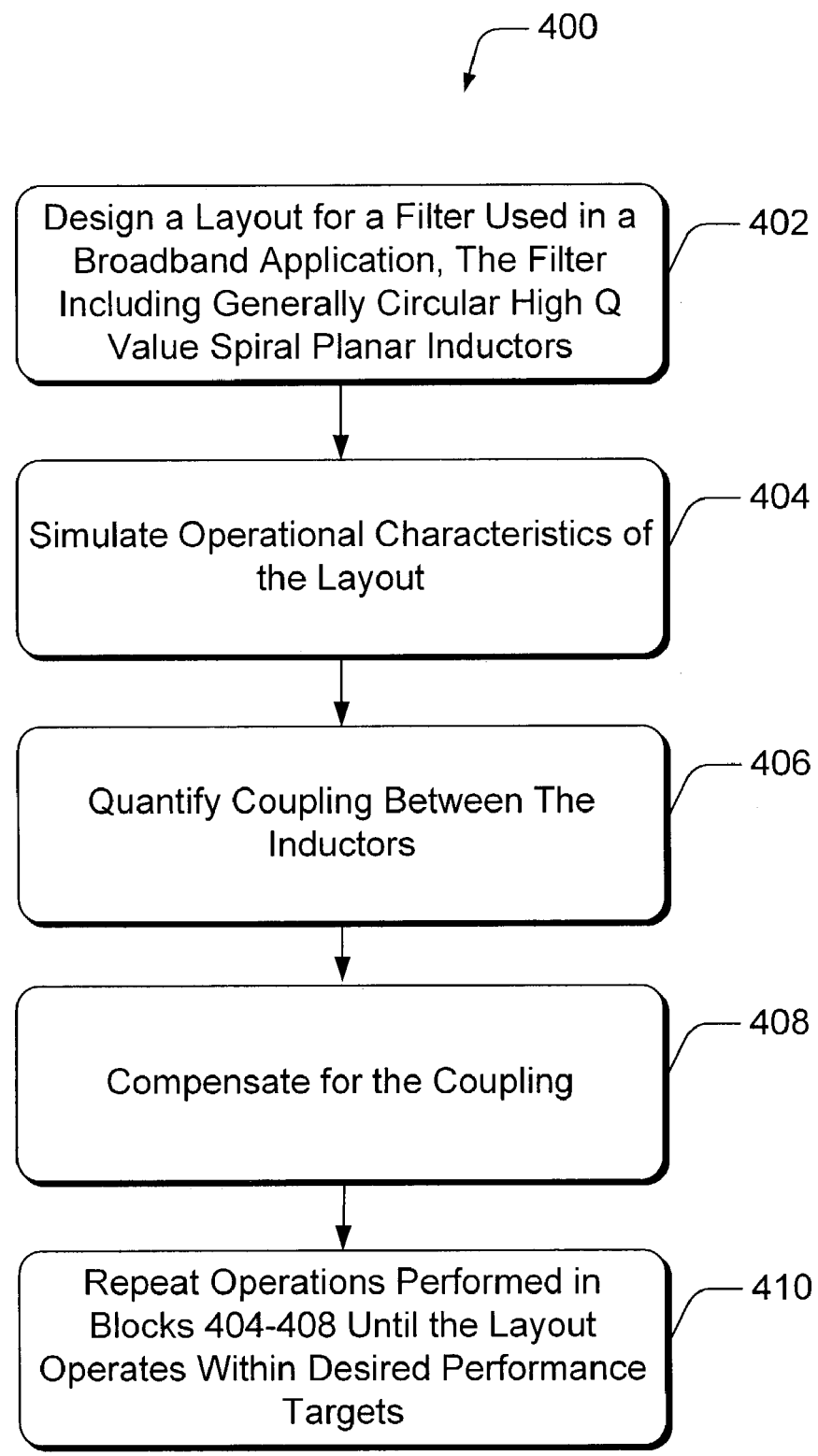
FIG. 4 shows an exemplary method for optimizing a design for making a filter used in a broadband application.

FIG. 4 shows an exemplary method 400 for optimizing a design for making a filter used in a broadband application. Method 400 exemplifies one embodiment of the design synthesis and optimization process described above. Method 400 is used in conjunction with the design of a filter that includes at least one generally circular high Q value spiral planar inductor. Method 400 includes blocks 402-410. The order in which the method is described is not intended to be construed as a limitation.

In block 402, a design layout for a filter (or other device) used in a broadband application is created. The filter includes one or more generally circular high Q value spiral planar inductors. For example, the filter may be a diplexer such as the one shown in FIG. 3. The design layout may be created manually or through the use of synthesis tools as described above.

In block 404, the layout is simulated to ascertain operational characteristics of the layout. For example, the layout may be EM tested and/or radio frequency tested. Optionally, Z-parameter or S-parameter data blocks may be substituted in the lumped element model that is either generated by the EM simulator or by manual measurements.

In block 406, once the circuit board layout is completed and imported into a simulator, coupling (K factors) between inductors are quantified.

In block 408, the couplings are compensated for by (i) introducing decoupling structures into the layout, (ii) changing inductor values for at least one of the generally circular high Q value spiral planar inductors, and/or (iii) modifying the layout.

In block 410, operations performed in blocks 404-408 are repeated until the layout operates within desired performance targets. For example, the K factors may be reloaded into a new lumped element model and all inductive and capacitive elements re-optimized. Then the circuit layout is modified according to the simulation results and then a new EM simulation is performed. This process may continue iteratively until desired simulated performance is achieved.

Although some implementations of the various methods and arrangements of the present invention have been illustrated in the accompanying Drawings and described in the foregoing Detailed Description, it will be understood that the invention is not limited to the exemplary aspects disclosed, but is capable of numerous rearrangements, modifications and substitutions without departing from the spirit of the invention as set forth and defined by the following claims.

What is claimed is:

1. An apparatus, comprising:
   a printed circuit board; and
   a filter comprising a generally circular high Quality factor (Q) value spiral planar inductor fabricated on the printed circuit board, the generally circular high Q value spiral planar inductor configured to operate in a broadband application, wherein the filter operates in a range from about 1-to-1000 MHz.

2. The apparatus as recited in claim 1, wherein the apparatus is a broadband interface module.

3. The apparatus as recited in claim 1, wherein the apparatus is a cable television module.

4. The apparatus as recited in claim 1, wherein the apparatus is an input and/or output filter.

5. The apparatus as recited in claim 1, wherein the apparatus is one of at least a diplexer, duplexer, and triplexer.

6. The apparatus as recited in claim 1, wherein the printed circuit board is an FR4 substrate.

7. The apparatus as recited in claim 1, wherein the generally circular high Q value spiral planar inductor is elliptical in shape.

8. An apparatus, comprising:
   a printed circuit board; and a filter, operable in a broadband communication interface application; the filter comprising a high Quality factor (Q) value spiral planar inductor having generally circular conductive traces fabricated on the printed circuit board, wherein an outer most conductive trace wraps around inner conductive traces that form a spiral leading to an inner most conductive trace, wherein the inner most conductive trace wraps around a center portion of the inductor, the center portion having no conductive traces, wherein the filter operates in a range from about 1-to-1000 MHz.

9. The apparatus as recited in claim 8, wherein the generally circular conductive traces form an ellipse.

10. The apparatus as recited in claim 8, wherein the conductive traces are spaced apart from each other.

11. The apparatus as recited in claim 10, wherein the conductive traces are spaced apart from each other by a distance in the range of 6 mils.

12. The apparatus as recited in claim 10, wherein the conductive traces are spaced apart from each other by a distance of about 0.12 mm, about 0.152 mm or about 0.2 mm.

13. The apparatus as recited in claim 8, wherein the filter comprises a plurality of the high Quality factor (Q) value spiral planar inductors.

14. The apparatus as recited in claim 8, wherein the apparatus is a broadband interface module.

15. The apparatus as recited in claim 8, wherein the apparatus is a cable television module.

16. The apparatus as recited in claim 8, wherein the apparatus is an input and/or output filter.

17. The apparatus as recited in claim 8, wherein the apparatus is one of at least a diplexer, duplexer, and tri-plexer.

18. The apparatus as recited in claim 8, wherein the printed circuit board is an FR4 substrate.

19. A diplexer, comprising:
a high pass filter and low pass filter, each operable in a broadband communication interface application, and each comprising at least one high Quality factor (Q) value spiral planar inductor fabricated on a printed circuit board; wherein the high Q value spiral planar inductor includes conductive traces fabricated on the printed circuit board forming an ellipse, wherein an outer most conductive trace wraps around inner conductive traces that form a spiral leading to an inner most conductive trace, wherein the inner most conductive trace wraps around a center portion of the inductor, the center portion having no conductive traces, wherein the diplexer operates in a range from about 1-to-1000 MHz.

20. The diplexer as recited in claim 19, wherein the conductive traces of the at least one high Quality factor (Q) value spiral planar inductor are spaced apart from each other by a distance in the range of 6 mils.

21. The diplexer as recited in claim 19, wherein the conductive traces of the at least one high Quality factor (Q) value spiral planar inductor are spaced apart from each other by a distance of about 0.12 mm, about 0.152 mm or about 0.2 mm.

22. A high performance planar spiral inductor, comprising: a plurality of generally circular conductive traces fabricated on a printed circuit board, wherein an outer most conductive trace wraps around inner conductive traces that form a spiral leading to an inner most conductive trace, wherein the inner most conductive trace wraps around a center portion of the inductor, the center portion having no conductive traces, wherein the high performance planar spiral inductor is for use in filter applications involving broadband applications, wherein the filter applications operate in a range from about 1-to-1000 MHz.

23. A high performance planar spiral inductor as recited in claim 22, Wherein the generally circular conductive traces form an ellipse.

24. The inductor as recited in claim 22, wherein the conductive traces are spaced apart from each other by a distance in the range of 6 mils.

25. The inductor as recited in claim 22, wherein the conductive traces are spaced apart from each other by a distance of about 0.12 mm, about 0.152 mm or about 0.2 mm.

26. A high performance planar spiral inductor, comprising: a plurality of generally circular conductive traces fabricated on a printed circuit board, wherein an outer most conductive trace wraps around inner conductive traces that form a spiral leading to an inner most conductive trace, wherein the inner most conductive trace wraps around a center portion of the inductor, the center portion having no conductive traces, wherein the high performance planar spiral inductor is for use in filter applications involving broadband applications, and wherein the inductor is configured to provide a self-resonant frequency for inductances of about 40 to 400 nH.

27. A method, comprising: fabricating a generally circular planar spiral inductor on a printed circuit board, the generally circular planar spiral inductor for use in a filter used in a broadband application, wherein the inductor is not a torroidal inductor, wherein the filter operates in a range from about 1-to-1000 MHz.

28. The method as recited in claim 27, further comprising fabricating a decoupling structure on the printed circuit board in proximity to the generally circular planar spiral inductor.

29. The method as recited in claim 27, wherein the broadband filter is an input and/or output filter.

30. The method as recited in claim 27, wherein the broadband filter is one of at least a diplexer, duplexer, and tri-plexer.

31. The method as recited in claim 27, wherein the printed circuit board is an FR4 substrate.

32. The method as recited in claim 27, wherein the generally circular planar spiral inductor is a high Quality factor (Q) value spiral planar inductor.

33. The method as recited in claim 27, wherein the generally circular planar spiral inductor is elliptical in shape.

34. The method as recited in claim 27, wherein the fabricating of the generally circular planar spiral inductor on a printed circuit board comprises fabricating an outer most conductive trace around inner conductive traces to form a spiral that leads to an inner most conductive trace, wherein the inner most conductive trace wraps around a center portion of the generally planar spiral inductor, the center portion having no conductive traces.

35. The method as recited in claim 34, wherein the conductive traces are spaced apart from each other by a distance in the range of 6 mils.

36. The method as recited in claim 34, wherein the conductive traces are spaced apart from each other by a distance of about 0.12 mm, about 0.152 mm or about 0.2 mm.

37. A method, comprising: fabricating a generally circular planar spiral inductor on a printed circuit board, the generally circular planar spiral inductor for use in a filter used in a broadband application, wherein the inductor is not a torroidal inductor and wherein the generally circular planar spiral inductor is configured to provide a self-resonant frequency for inductances of about 40 to 400 nH.

38. An apparatus, comprising:
a printed circuit board;
a filter comprising first and second generally circular high Quality factor (Q) value spiral planar inductors fabricated on the printed circuit board; and
a decoupling structure fabricated on the printed circuit board in proximity to the first and second generally circular high Q value spiral planar inductors configured to reduce unwanted electromagnetic coupling between the first and second generally circular high Q value spiral planar inductors when current flows through the first and second generally circular high Q value spiral planar inductors.

39. The apparatus as recited in claim 38, wherein the apparatus is a broadband interface module.

40. The apparatus as recited in claim 38, wherein the apparatus is a cable television module.

41. The apparatus as recited in claim 38, wherein the apparatus is an input and/or output filter.

42. The apparatus as recited in claim 38, wherein the apparatus is one of at least a diplexer, duplexer, and triplexer.

43. The apparatus as recited in claim 38, wherein the printed circuit board is an FR4 substrate.

44. The apparatus as recited in claim 38, wherein the first and second generally circular high Q value spiral planar inductors are elliptical in shape.

45. The apparatus as recited in claim 38, wherein the decoupling structure is a metal trace in the printed circuit board.

46. The apparatus as recited in claim 38, wherein the first and/or second generally circular high Q value spiral planar inductors induce current to flow in the decoupling structure thereby generating a magnetic field opposite that of magnetic fields generated by the first and/or second generally circular high Q value spiral planar inductors when current flows through the first and/or second generally circular high Q value spiral planar inductors.

47. An apparatus, comprising:
a printed circuit board;
a filter, operable in a broadband communication interface application; the filter comprising a plurality of high Quality factor (Q) value spiral planar inductors each having generally circular conductive traces fabricated on the printed circuit board, wherein an outer most conductive trace wraps around inner conductive traces that form a spiral leading to an inner most conductive trace, wherein the inner most conductive trace wraps around a center portion of the inductor, the center portion having no conductive traces; and
a decoupling structure, fabricated on the printed circuit board in proximity to the plurality of high Q value spiral planar inductors, configured to reduce unwanted electromagnetic coupling to at least one of the a plurality of high Q value spiral planar inductors when current flows through one or more of the plurality of high Q value spiral planar inductors.

48. The apparatus as recited in claim 42, wherein the filter operates in a range from about 1-to-1000 MHz.

49. The apparatus as recited in claim 47, wherein the generally circular conductive traces form an ellipse.

50. The apparatus as recited in claim 47, wherein the conductive traces are spaced apart from each other.

51. The apparatus as recited in claim 47, wherein the decoupling structure is a metal trace in the printed circuit board.

52. The apparatus as recited in claim 47, wherein the apparatus is a broadband interface module.

53. The apparatus as recited in claim 47, wherein the apparatus is a cable television module.

54. The apparatus as recited in claim 47, wherein the apparatus is an input and/or output filter.

55. The apparatus as recited in claim 47, wherein the apparatus is one of at least a diplexer, duplexer, and triplexer.

56. The apparatus as recited in claim 47, wherein the printed circuit board is an FR4 substrate.

57. The apparatus as recited in claim 47, wherein at least one of the plurality of planar inductors induce current to flow in the decoupling structure thereby generating a magnetic field opposite that of magnetic fields generated by one or more of the a plurality of high Q value spiral planar inductors.

58. A diplexer, comprising:
a high pass filter and low pass filter each comprising at least one high Quality factor (Q) value spiral planar inductor fabricated on a printed circuit board; wherein the high Q value spiral planar inductor includes conductive traces fabricated on the printed circuit board generally forming an circle, wherein an outer most conductive trace wraps around inner conductive traces that form a spiral leading to an inner most conductive trace, wherein the inner most conductive trace wraps around a center portion of the inductor, the center portion having no conductive traces; and
a decoupling structure, fabricated on the printed circuit board in proximity to the high pass filter and/or the low pass filter, configured to reduce occurrences of unwanted electromagnetic coupling to the high pass filter and/or the low pass filter when current flows through the high pass filter and/or low pass filter.

59. The diplexer as recited in claim 58, wherein the decoupling structure is a metal trace in the printed circuit board.

60. The diplexer as recited in claim 58, wherein the printed circuit board is an FR4 substrate.

61. A method, comprising:
(a) designing a layout for a filter for use in a broadband application, the filter comprising generally circular high Quality factor (Q) value spiral planar inductors fabricated on a printed circuit board;
(b) simulating operational characteristics of the layout;
(c) quantifying coupling between the generally circular high Q value spiral planar inductors; and
(d) compensating for the coupling by (i) introducing decoupling structures into the layout, (ii) changing inductor values for at least one of the generally circular high Q value spiral planar inductors, and/or (iii) modifying the layout.

62. The method as recited in claim 61, further comprising:
re-simulating the layout; and
ascertaining whether the simulated operational characteristics of the layout are within desired performance targets.

63. The method as recited in claim 61, further comprising iteratively repeating operations performed in paragraphs (b), (c) and (d) until the layout operates within desired performance targets.

64. The method as recited in claim 61, wherein the simulating includes electromagnetic simulation.

65. The method as recited in claim 61, wherein the simulating includes radio frequency simulation.

66. The method as recited in claim 61, wherein the simulating includes using a lumped element simulator model in conjunction with electromagnetic simulation.

67. A method, comprising:
(a) designing a layout for a filter for use in a broadband application, the filter comprising generally circular high Quality factor (Q) value spiral planar inductors fabricated on a printed circuit board;
(b) simulating operational characteristics of the layout, wherein the simulating includes using a lumped element simulator model in conjunction with electromagnetic simulation;
(c) quantifying coupling between the generally circular high Q value spiral planar inductors; and
(d) compensating for the coupling by (i) introducing decoupling structures into the layout, (ii) changing inductor values for at least one of the generally circular high Q value spiral planar inductors, and/or (iii) modifying the layout.

68. The method as recited in claim 67, further comprising fabricating (i) the generally circular high Q value spiral planar inductors on a printed circuit board in accordance with the simulated layout.

69. The method as recited in claim 67, further comprising fabricating at least one decoupling structure on the printed circuit board in proximity to at least one of the generally circular high Q value spiral planar inductors.

70. The method as recited in claim 67, wherein at least one of the generally circular high Q value spiral planar inductors is elliptical in shape.

71. A method, comprising:
(a) designing a layout for a filter for use in a broadband application, the filter comprising generally circular high Quality factor (Q) value spiral planar inductors fabricated on a printed circuit board;
(b) simulating operational characteristics of the layout, wherein the simulating includes using a lumped element simulator model in conjunction with electromagnetic simulation;
(c) quantifying coupling between the generally circular high Q value spiral planar inductors; and
(d) compensating for the coupling by (i) introducing decoupling structures into the layout, (ii) changing inductor values for at least one of the generally circular high Q value spiral planar inductors, and/or (iii) modifying the layout.

72. The method as recited in claim 71, further comprising fabricating (i) the generally circular value spiral planar inductors on a printed circuit board in accordance with the simulated layout.

73. The method as recited in claim 71, further comprising fabricating at least one decoupling structure on the printed circuit board in proximity to at least one of the generally circular high Q value spiral planar inductors.

74. The method as recited in claim 71, wherein at least one of the generally circular high Q value spiral planar inductors is elliptical in shape.

75. A method, comprising:
(a) synthesizing a filter design for a broadband application to produce values for inductors used in the filter;
(b) designing generally circular high Quality factor (Q) value spiral planar inductors with values that match the values obtained from the synthesizing, each of the generally circular high Q value spiral planar inductors are configured to be into fabricated on a printed circuit board;
(c) electro magnetically simulating operation of each of the generally circular high Q value spiral planar inductors;
(d) quantifying coupling between the generally circular high Q value spiral planar inductors; and
(e) adjusting the coupling and/or inductance values assigned to the generally circular high Q value spiral planar inductors until electromagnetic simulated operation of the generally circular high Q value spiral planar inductors match target operating characteristics for the synthesized filter design.

76. The method as recited in claim 75, further comprising using a behavior model in conjunction with the electromagnet simulation.

* * * * *